United States Patent [19]

Pyndiah et al.

[11] Patent Number: 4,845,389

[45] Date of Patent: Jul. 4, 1989

[54] VERY HIGH FREQUENCY MIXER

[75] Inventors: Ramesh Pyndiah, Valenton; Patrice Gamand, Chennevieres/Marne, both of France

[73] Assignee: U.S. Philips Corporation, New York, N.Y.

[21] Appl. No.: 162,522

[22] Filed: Mar. 1, 1988

[30] Foreign Application Priority Data

Mar. 6, 1987 [FR] France ................................ 87 03084

[51] Int. Cl.$^4$ ...................... G06G 7/00; H03K 17/687
[52] U.S. Cl. .................................. 307/529; 307/572; 333/218
[58] Field of Search ................ 307/529, 572; 333/218, 333/16, 160

[56] References Cited

U.S. PATENT DOCUMENTS

| | | | |
|---|---|---|---|
| 3,523,199 | 8/1970 | Phuoc et al. | 328/160 |
| 4,308,473 | 12/1981 | Carnes | 307/529 |
| 4,327,343 | 4/1982 | Cornish | 333/218 |

FOREIGN PATENT DOCUMENTS 1109860 8/1984 U.S.S.R. .

OTHER PUBLICATIONS

"Dual-Gate MESFET Mixers", IEEE Transactions on Microwave Theory and Techniques, vol. MTT-32, No. 3, Mar. 1984, by Christos Tsironis et al.
"Performance of a Dual-Gate GaAs MESFET as a Frequency Multiplier at Ku-Band", IEEE Transactions on Microwave Theory and Techniques, vol. MTT-27, No. 5, May 1979, by Philip Chen et al.

Primary Examiner—Stanley D. Miller
Assistant Examiner—Richard Roseen
Attorney, Agent, or Firm—Edward W. Goodman

[57] ABSTRACT

A mixer of the two-transistor type ($T_1$, $T_2$) arranged in series by a source $S_2$ and a drain $D_1$. A Gate $G_1$ receives a radio frequency signal RF and a gate $G_2$ a local oscillator signal L0. Matching networks $R_1$ and $R_2$ are provided for the respective signals RF and L0. One element of the network $R_3$ positioned at the output (drain $D_2$ of the transistor $T_2$) restores a short-circuit at the frequency $f_{L0}$ of the local oscillator. The instability of the input $G_2$ of the transistor $T_2$ is compensated for by an inductor element L inserted between the junction point of the source $S_2$ and the drain $D_1$ and the common-mode pole.

7 Claims, 2 Drawing Sheets

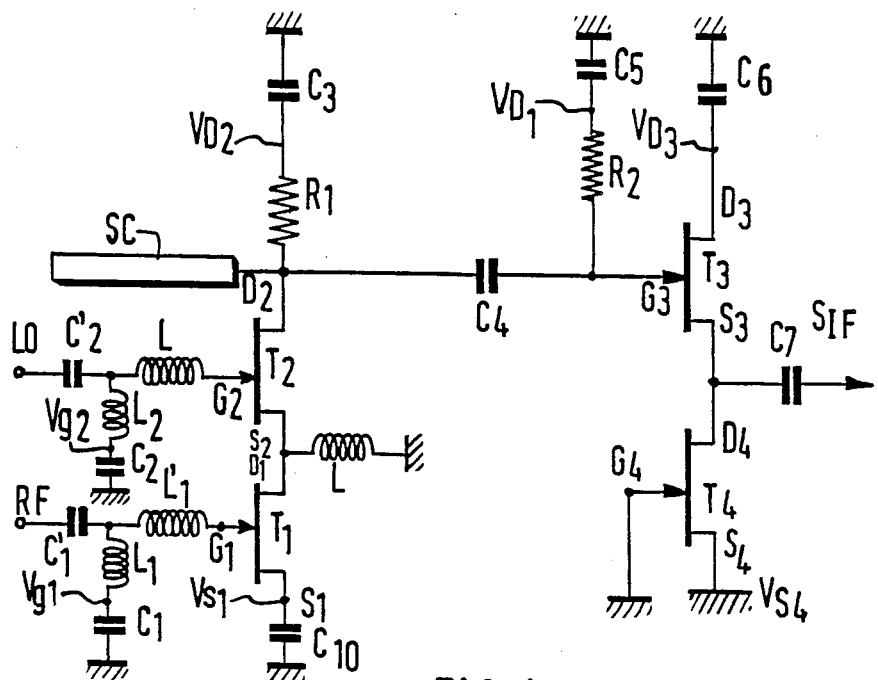
FIG. 4
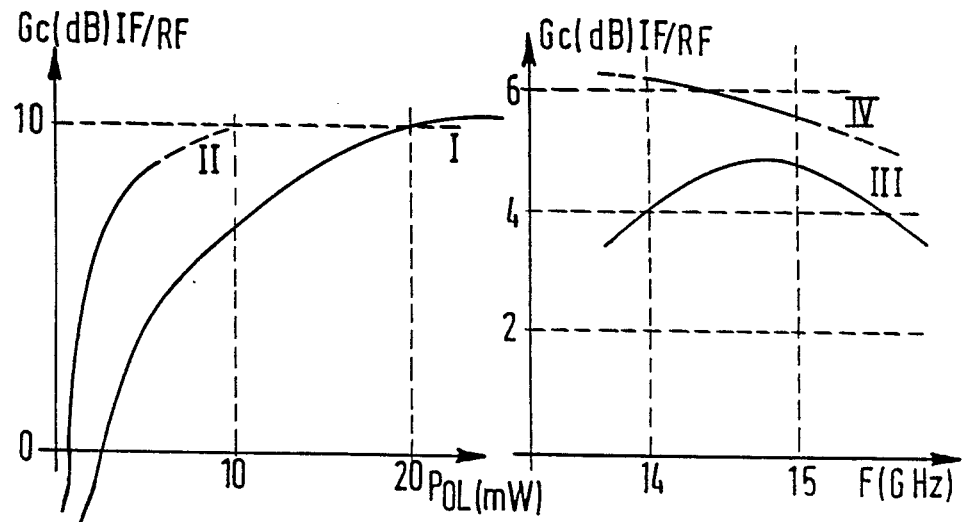
FIG. 5
FIG. 6

VERY HIGH FREQUENCY MIXER

BACKGROUND OF THE INVENTION

1. Field of the Invention

The present invention relates to a very high frequency mixer comprising a first and a second field effect transistor, one of the transistors being intended to receive at its gate a local oscillator signal and the other transistor a radio-frequency input signal, the first transistor having a source connected to a first supply voltage pole, and a drain connected at a junction point to a source of the second transistor, and the drain of the second transistor being connected to a second supply voltage pole via a resistor.

2. Description of Related Art

Such a mixer is described in the article published by Peter HARROP et al. in the publication "Proceedings of the Sixth European Microwave Conference", Rome, 14–17 September 1976, pp. 8–13.

This mixer is designed to operate within the range of approximately 7–9 GHz.

The applicants have established that the higher the cut-off frequency $f_T$ of the transistor became the more unstable became the input at the gate of the second transistor.

The applicants have been able to establish that this instability was due to the drain-source capacitance of the two transistors, on the one hand, and, on the other hand, to the effect of the cut-off frequency $f_T$ of the transistors, their gate-drain capacitance having no determining effect on this instability.

SUMMARY OF THE INVENTION

The subject invention proposes to realize a compensation which permits to control this instability.

With this object, the mixer according to the invention is characterized in tht the drain of the second transistor is charged by a circuit element realizing a short-circuit at the frequency of the local oscillator signal, and in that it comprises an inductor element inserted between the junction point and a common-mode pole, the value of the inductor element being selected such as to compensate for the drain-source capacitances of the transistors and thus to eliminate the instability of the input at the gate of the second transistor.

In an advantageous embodiment, the first transistor is intended to receive at its gate the radio-frequency signal, and the second transistor is intended to receive at its gate the local oscillator signal.

The gates of the first and/or second transistor(s) can include at the input a matching circuit for the radio-frequency signal and/or the local oscillator signal.

BRIEF DESCRIPTION OF THE DRAWING

The invention will be better understood by means of the following description given by way of non-limiting example with reference to the drawings, in which:

FIG. 4 shows an embodiment of the mixer as shown in FIG. 2; and

FIGS. 5 and 6 show a comparison between a circuit according to the invention and a circuit according to the prior art, in the neighborhood of 15 GHz and having an intermediate frequency of 200 Mhz, as far as the gain curves are concerned as a function of the power of the local oscillator and the frequency, respectively.

DESCRIPTION OF THE PREFERRED EMBODIMENT

Figure 1:
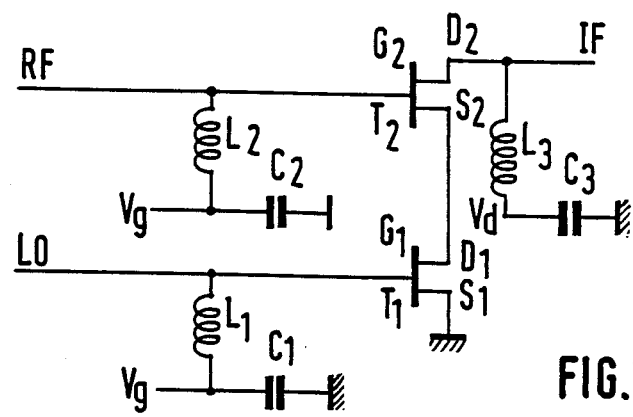
FIG. 1 shows a mixer in accordance with the prior art.

According to FIG. 1, a mixer described in the above-mentioned article comprises a field effect transistor $T_1$ on a substrate AsGa, in this case a transistor of the MESFET type, having a source $S_1$ connected to a common-mode pole, a gate $G_1$ receiving a local oscillator signal LO, and a drain $D_1$ connected to the source $S_2$ of a field effect transistor $T_2$ on an AsGa substrate, in this case also of the MESFET type. The transistor $T_2$ receives at its gate $G_2$ a radio-frequency signal RF and produces on its output, constituted by its drain $D_2$, an intermediate-frequency signal IF.

Between the gates $G_1$ and $G_2$ and the common-mode pole are arranged two feeding networks comprising an inductor and a capacitor connected in series, that is to say $(L_1, C_1)$ for the transistor $T_1$, and $(L_2, C_2)$ for the transistor $T_2$, the junction point for the two elements of each network receiving a gate bias voltage Vg.

Finally, between the drain $D_2$ of the transistor $T_2$ and the common-mode pole, is arranged a feeding network comprising an inductor $L_3$ and a capacitor $C_3$, connected in series. te junction point of the inductor $L_3$ and the capacitor $C_3$ is biassed by a drain bias voltage Vd.

Such a circuit is designed having transistors comprising a gate of approximately 0.8 micron in length.

If one wishes to realize a mixer operating at a higher frequency, and therefore uses transistors whose intrinsic cut-off frequency is much higher than in the preceding case, the applicants have established that an instability appeared at the gate $G_2$. This instability can be compensated by mismatching the input of the gate $G_2$, but at the cost of a considerable increase, the power of the signal injected into this gate; a power of approximately 20 mV has been found to be necessary for maintaining a correct gain factor between the intermediate-frequency output signal FI and the radio-frequency input signal RF.

Figure 2:
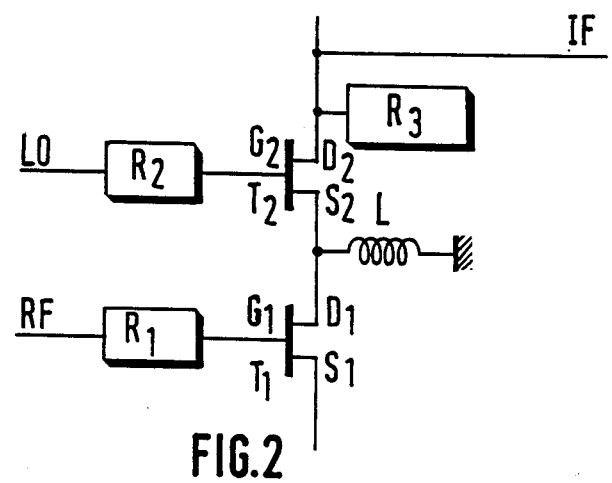
FIG. 2 shows a mixer in accordance with the present invention.

According to FIG. 2, a transistor $T_1$ receives the radio-frequency signal RF via a matching network $R_1$, and the transistor $T_2$ receives the local oscillator signal LO via a matching network $R_2$, these networks including the power supplies. As shown in the article by Christos TSIRONIS et al., published in IEEE Transactions on microwave Theory and Techniques, Vol. MTT 32, No.3, March 1984, pp. 248–255, this drive mode is more advantageous because non-linearities occur essentially in the field effect transistor $T_2$ (transconductance $gm_2$ and channel resistance $Rd_2$) and the field effect transistor $T_1$ only amplifies the radio-frequency signal.

The high frequencies (LO, RF) are short-circuited using an elementary network $R_3$ which can be, for example, a $\lambda/4$ open microstripline ($\lambda$ designating the wavelength corresponding with the local oscillator frequency) or also a capacitor having a low value (approximately 1 pF) of the interdigitated type being in series resonance at the local oscillator frequency (cf.the article by Christios TSIRONIS et al., p. 249 II).

According to the invention, the input at gate $G_2$ of transistor $T_2$ is stabilized by arranging an inductor element L, having a conveniently chosen value, between the junction point of the drain $D_1$ of the transistor $T_1$ and the source $S_2$ of the transistor $T_2$, and the common-mode pole.

Figure 3:
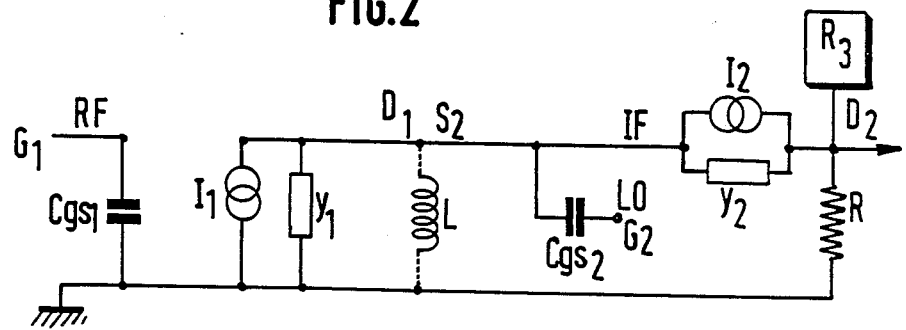
FIG. 3 shows an equivalent diagram representing the operation of the circuit shown in FIG. 1, having in a dotted line the inductor L arranged according to the present invention (FIG. 2)

The structure of the circuit of FIG. 2 can be given in a first approximately by the circuit of FIG. 3. The transistors $T_1$ ($T_2$) are determined by the capacitors $Cgs_1$ ($Cgs_2$), the voltage-controlled current sources $I_1$ ($I_2$) and the output impedances $y_1$ ($y_2$). The drain of the second transistor $T_2$ is charged via an open circuit line $R_3$ which restores a short-circuit at the local oscillator frequency LO and by a resistor R connected to the common-mode pole. The radio-frequency signal RF injected into the capacitor $Cgs_1$ is amplified by the first transistor $T_1$ and injected into the source of the second transistor $T_2$ where the non-linearities, due to the strong signal from the local oscillator LO injected into the capacitor $Cgs_2$ of the second transistor $T_2$, generate the intermediate-frequency signal $F_I$ which is taken-off at the drain of the second transistor $T_2$.

We have:

$$y_1 = gd_1 + j\omega Cds_1$$

$$y_2 = gd_2 + j\omega Cds_2$$

with
 $gd_1$, $gd_2$ = drain-source conductance of the respective transistors $T_1$ and $T_2$.
 $CdS_1$, $CdS_2$: drain-source capacitance of the respective transistors $T_1$ and $T_2$.

At the local oscillator frequency LO, the input impedance Zi of the gate $G_2$ of the transistor $T_2$ can then be described as (disregarding the inductor element L):

$$Zi = \frac{gd_1 + gd_2 - gm_2(Cds_1 + Cds_2)/Cgs_2}{(gd_1 + gd_2)^2 + \omega^2(Cds_1 + Cds_2)^2} - j$$

$$\frac{[(Cds_1 + Cds_2)\omega + (gd_1 + gd_2)gm_2/\omega Cgs_2]}{(gd_1 + gd_2)^2 + \omega^2(Cds_1 + Cds_2)^2} + \frac{1}{j\omega Cgs_2}$$

with
 $gm_2$ = transconductance of the transistor $T_2$
 $Ggs_2$ = gate source capacitance of the transistor $T_2$ The instability is due to the fact that the real term again has a negative value when transistors are used having a high cut-off frequency $f_T$.

In fact, the cut-off frequency $fT_2$ of the transistor $T_2$, which is defined as the frequency at wich its gain is 0 dB, has for its value:

$$fT_2 = \frac{gm_2}{2\pi Cgs_2}$$

The instability occurs when:

$$A = gd_1 + gd_2 - gm_2(Cds_1 + Cds_2) - Cgs_2 < 0$$

or $$A = gd_1 + gd_2 - 2\pi fT_2(Cds_1 + Cds_2) < 0.$$

The higher the cut-off frequency $fT_2$ of transistor $T_2$ is, the more important becomes the instability.

A solution for eliminating this instability consists in mismatching the input $G_2$ of the transistor $T_2$ and introducing a resistor which permits to render the resistive term of the input impedance Zi positive. This solution has the disadvantage of considerably increasing the required power of the local oscillator signal LO.

According to the invention, the inductor element L is arranged between the drain $D_1$ interconnected with the source $S_2$, and the common-mode pole.

The expression of the input impedance Zi then becomes (always at the local oscillator frequency LO:

$$Zi = \frac{1}{D}\left[gd_1 + gd_2 - 2\pi fT_2\left(Cds_1 + Cds_2 - \frac{1}{\omega^2 L}\right)\right] -$$

$$j\frac{1}{D}\left[\omega\left(Cds_1 + Cds_2 - \frac{1}{\omega^2 L}\right) + (gd_1 + gd_2)\frac{\omega T}{\omega}\right] +$$

$$\frac{1}{j\omega Cgs_2} \text{ with } \omega T = 2\pi fT \text{ and}$$

$$D = (gd_1 + gd_2)^2 + \omega^2\left(Cds_1 + Cds_2 - \frac{1}{\omega^2 L}\right)^2$$

The instability will be compensated when:

$$A' = gd_1 + gd_2 - 2\pi fT_2\left(Cds_1 + Cds_2 - \frac{1}{\omega^2 L}\right) \geq 0$$

that is to say:

$$L \leq \frac{1}{\omega_0^2}\frac{2\pi fT_2}{2\pi fT_2 \, Cds - gd}$$

with
 $Cds = Cds_1 + Cds_2$
 $gd = gd_1 + gd_2$
 $\omega_0 = 2\pi Fo$
 $Fo$ = the highest local oscillator frequency LO.

When the instability is compensated in this manner, it is possible to match the input with the gate $G_2$ and thus control the mixer with minimum power.

By using the inductor element L, other advantages can also be obtained.

In the first place, the effect of the presence of this inductor is the fact that the center of the arrangement ($D_1$, $S_2$) is brought back to the direct current common-mode pole, which permits biasing the transistors $T_1$ and $T_2$ independently.

Then, the inductor L short-circuits the intermediate frequency IF noise generated by the first transistor $T_1$ of the mixer, which is particularly interesting in the case of very high frequency transistors, for example of the MESFET type.

The low-frequency noise generated by the transistor $T_1$ is amplified by the transistor $T_2$.

The value of the voltage V at the drain $D_1$ of the first transistor (source $S_2$ of transistor $T_2$) is given by the following formula:

$$V = \frac{RdIo}{1 + j\omega Cds \, Rd\left[1 - \left(\frac{\omega 1}{\omega}\right)^2\right]}$$

with $Rd = \frac{1}{gd}$

-continued $$\omega_1 = \frac{1}{\sqrt{LC_{ds}}}$$

with $I_0 = I_1$ = noise current generated by the first transistor $T_1$.

Worded differently, the inductor L permits realizing a bandpass filter whose central frequency is situated within the useful receiver band, so as to filter the noise situated in the intermediate-frequency band and generated by the first transistor $T_1$.

Finally, the inductor L can be chosen for matching the output at the drain $D_1$ of the transistor $T_1$ with the input at the source of transistor $T_2$.

The matching condition can be written as:

$$\frac{1}{\omega^2_{RF}L} = C_{ds}$$

$\omega_{RF} = 2\pi F_{RF}$, $F_{RF}$ denoting the frequency received, and $F_{RF} \neq F_{LO}$.

In this case, $A' = gd > 0$.

According to FIG. 4, the mixer comprises two stages, a first stage having the actual mixing function and a second stage forming a buffer.

The source $S_1$ of transistor $T_1$ is connected to the common-mode pole via a by-pass capacitor $C_{10}$, the source $S_1$ being fed by a negative voltage source $V_{S1}$, and the drain $D_2$ of the transistor $T_2$ to the common-mode pole via two elements in a series arrangement, that is to say a resistor $R_1$ and a by-pass capacitor $C_3$, the junction point of these two elements being fed by a bias voltage drain source $V_{D2}$.

The inputs of the radio-frequency signal RF and the local oscillator signal LO are realized via the very high frequency connecting capacitors $C'_1$ and $C'_2$, respectively. The input matching network $R_1$ at to the gate $G_1$ comprises an inductor element $L'_1$, arranged in series with the capacitor $C'_1$ and connected to the gate $G_1$, and, between the junction point of the capacitor $C'_1$ and the inductor element $L'_1$, on the one hand, and the common-mode pole, on the other hand, it comprises an inductor element $L_1$ and a very high frequency by-pass capacitor $C_1$. The junction point of the inductor element $L_1$ and the capacitor $C_1$ receives a gate bias voltage $V_{g1}$. The input matching network $R_2$ at the gate $G_2$ comprises an inductor element $L'_2$ arranged in series with a capacitor $C'_2$ and connected to the gate $G_2$, and, between the junction point of the capacitor $C'_2$ and the inductor element $L'_2$, on the one hand, and the common-mode pole, on the other hand, it comprises an inductor element $L_2$ and a very high frequency by-pass capacitor $C_2$. The junction point of the inductor element $L_2$ and the capacitor $C_2$ receives a gate bias voltage $V_{g2}$.

The network $R_3$ is represented by a transmission line SC, $\lambda_{LO}/4$ in length ($\lambda_{LO}$ denoting the wavelength of the local oscillator frequency in the substrate).

An intermediate frequency IF connecting capacitor $C_4$ is inserted between the drain $D_2$ of transistor $T_2$ and the gate $G_3$ of a field effect transistor $T_3$. The gate $G_3$ is biassed by a voltage $V_{D1}$ applied to the common terminal of an intermediate-frequency by-pass capacitor $C_5$ and a resistor $R_2$. The remaining terminal of the capacitor $C_5$ is connected to the common-mode pole and the remaining terminal of resistor $R_2$ to the gate $G_3$. The drain $D_3$ of the transistor $T_3$ receives a drain bias voltage $V_{D3}$ and is connected to the common-mode pole via an intermediate-frequency by-pass capacitor $C_6$. The source $S_3$ of the transistor $T_3$ is connected to the drain $D_4$ of a transistor $T_4$ whose source $S_4$ is connected to the common-mode pole and whose gate $G_4$ is connected to the common-mode pole.

The intermediate-frequency signal $S_{IF}$ is obtained at the junction point of $S_3$ and $D_4$ after passing through an intermediate-frequency connecting capacitor $C_7$.

The FIGS. 5 and 6 show the results which can be obtained with the mixer as shown in FIG. 4 compared to the arrangements not comprising the inductor element $L_1$ and for which one is forced to purposely mismatch the input at the gate $G_2$ by leaving out the inductor element $L'_2$ and by substituting a resistor for the inductor element $L_2$.

FIG. 6 shows the gain expressed in dB as a function of the power P of the local oscillator signal, for an intermediate-frequency value $f_{IF}$ of 200 MHz and a local oscillator frequency value $f_{LO}$ of 15 GHz. The curve I corresponds with the prior art and the curve II with the circuit of FIG. 4. The required mismatching of the input at the gate $G_2$ necessitates a much higher power of the oscillator signal than the prior art circuits.

FIG. 6 shows the gain expressed in dB as a function of the frequency, a curve III corresponding to a power $P_{LO}$ of the local oscillator signal LO of 5.5 mW (7.5 dBm) for a prior art circuit, and the curve IV to a power $P_{LO}$ of 1.6 mW (2 dBm) for the circuit of FIG. 4, with in the two cases an intermediate-frequency $f_{IF}$ of 200 MHz. The curve IV, although it corresponds to a power injected by the local oscillator which is more than two times smaller, corresponds to gains which are higher than those of the curve III.

The invention is not restricted to the embodiments described and shown. For example, the inductor elements can be realized in different manners; inductor or transmission line known by the English names of microstrips or coplanar lines.

A mixer according to the invention is integrable on substrate $Al_2O_3$ and monolithically integrable on the GaAs substrate.

What is claimed is:

1. A very high frequency mixer comprising a first and a second field effect transistor, one of the transistors being intended to receive at its gate a local oscillator signal and the other transistor a radio-frequency input signal, the first transistor having a source connected to a first supply voltage pole, and a drain connected at a junction point to a source of the second transistor, and a drain of the second transistor being connected to a second supply voltage pole via a resistor, characterized in that the drain of the second transistor is charged by a circuit element realizing a short-circuit at the frequency of the local oscillator signal, and in that the mixer further comprises an inductor element inserted between the junction point and a common-mode pole, the inductor element being selected such as to compensate for drain-source capacitances of the two transistors and thus to stabilize the input at the gate of a second transistor.

2. A mixer as claimed in claim 1, wherein the first transistor is intended to receive at its gate the radio-frequency signal and the second transistor is intended to receive at its gate the local oscillator signal.

3. A mixer as claimed in claim 2, the gate of the first transistor comprises a circuit for matching the signal which it is intended to receive.

4. A mixer as claimed in claim 3, wherein the gate of the second transistor ($T_2$) comprises a matching circuit for the signal which it is intended to receive.

5. A mixer as claimed in one of the preceding claims 1–4 wherein the inductor element has a value L such that:

$$L \leq \frac{2\pi f T_2}{2\pi f T_2\, Cds - gd} \cdot \frac{1}{\omega_0^2}$$

with:
- $fT_2$ being the cut-off frequency at 0 dB of the second transistor,
- $Cgs_2$ being the gate source capacitor of the second transistor $Cds_1$ and $Cds_2$ being drain-source capacitors of the first and second transistors, respectively,
- $gd_1$ and $gd_2$ being conductances of the first and second transistors, respectively, and $Cds = CDs_1 + Cds_2$, $gd = gd_1 + gd_2$
$\omega_0 = 2\pi F_0 F_o =$ the highest local oscillator frequency.

6. A mixer as claimed in claim 5, wherein the inductor element L is chosen such as to realize a bandpass filter whose central frequency is situated substantially within the useful receiver band, so as to filter out noise situated in the intermediate-frequency band and generated by the first transistor $T_1$.

7. A mixer as claimed in claim 5, wherein the inductor element has a value L in the neighborhood of LO with:

$$L = \frac{1}{Cds\, w_{RF}^2}$$

where $w_{RF} = 2\pi F_{RF}$, $F_{RF}$ denoting the frequency of the input signal and $F_{RF} = F_{LO}$.

* * * * *